United States Patent
Braune

(10) Patent No.: US 9,055,655 B2
(45) Date of Patent: Jun. 9, 2015

(54) CONVERSION MEDIUM BODY, OPTOELECTRONIC SEMICONDUCTOR CHIP AND METHOD OF PRODUCING AN OPTOELECTRONIC SEMICONDUCTOR CHIP

(75) Inventor: Bert Braune, Wenzenbach (DE)

(73) Assignee: OSRAM Opto Semiconductors GmbH (DE)

( * ) Notice: Subject to any disclaimer, the term of this patent is extended or adjusted under 35 U.S.C. 154(b) by 380 days.

(21) Appl. No.: 13/377,593

(22) PCT Filed: Aug. 10, 2010

(86) PCT No.: PCT/EP2010/061648
§ 371 (c)(1),
(2), (4) Date: Dec. 29, 2011

(87) PCT Pub. No.: WO2011/026716
PCT Pub. Date: Mar. 10, 2011

(65) Prior Publication Data
US 2012/0146076 A1 Jun. 14, 2012

(30) Foreign Application Priority Data
Sep. 4, 2009 (DE) .......................... 10 2009 040 148

(51) Int. Cl.
*H01L 33/50* (2010.01)
*H05B 33/14* (2006.01)
(Continued)

(52) U.S. Cl.
CPC ............ *H05B 33/145* (2013.01); *H01L 33/501* (2013.01); *H01L 33/508* (2013.01); *H01L 2933/0041* (2013.01); *H05B 33/10* (2013.01); *H01L 24/24* (2013.01);
(Continued)

(58) Field of Classification Search
CPC ................................................. H01L 33/501
See application file for complete search history.

(56) References Cited

U.S. PATENT DOCUMENTS

2007/0262339 A1 11/2007 Hussell et al.
2008/0048200 A1 2/2008 Mueller et al.
2008/0308828 A1 12/2008 Kashiwagi et al.
(Continued)

FOREIGN PATENT DOCUMENTS

CN 1976069 A 6/2007
CN 101333422 A 12/2008
(Continued)

OTHER PUBLICATIONS

The Taiwanese Examination Report issued Dec. 26, 2013 for Taiwanese Patent Application No. 099129814.
(Continued)

*Primary Examiner* — Matthew Reames
(74) *Attorney, Agent, or Firm* — DLA Piper LLP

(57) ABSTRACT

A method of producing an optoelectronic semiconductor chip includes providing a semiconductor layer sequence with at least one active layer, providing a one-piece conversion medium body, wherein a matrix material is incompletely crosslinked and/or cured, and wherein the conversion medium body exhibits at room temperature a hardness of Shore A 0 to Shore A 35 and/or a viscosity of 10 Pa·s to 150 Pa·s, placing the conversion medium body onto the semiconductor layer sequence such that they are in direct contact with one another, and curing the conversion medium body wherein after curing the hardness of the conversion medium body is Shore A 30 to Shore D 80.

10 Claims, 3 Drawing Sheets

(51) Int. Cl.
*H05B 33/10* (2006.01)
*H01L 23/00* (2006.01)

(52) U.S. Cl.
CPC ............. *H01L 2224/48091* (2013.01); *H01L 2224/48227* (2013.01); *H01L 2924/12041* (2013.01)

(56) References Cited

U.S. PATENT DOCUMENTS

| | | | |
|---|---|---|---|
| 2009/0020779 A1* | 1/2009 | Yamada et al. | ............... 257/100 |
| 2010/0320479 A1 | 12/2010 | Minato et al. | |
| 2012/0267998 A1 | 10/2012 | Sohn et al. | |

FOREIGN PATENT DOCUMENTS

| | | |
|---|---|---|
| DE | 10 2007 054 800 A1 | 4/2009 |
| EP | 1 510 565 B1 | 11/2006 |
| EP | 2 043 165 A1 | 4/2009 |
| JP | 2003-142737 | 5/2003 |
| JP | 2007-19096 | 1/2007 |
| JP | 2007-146008 | 6/2007 |
| JP | 2009-188207 | 8/2009 |
| JP | 2009-530437 | 8/2009 |
| JP | 2009-235368 | 10/2009 |
| WO | 2007/127029 A2 | 11/2007 |
| WO | 2008/104936 | 9/2008 |
| WO | 2009/069671 | 6/2009 |
| WO | 2009/119038 A2 | 10/2009 |

OTHER PUBLICATIONS

A Chinese Examination Report dated Feb. 8, 2014 for corresponding Chinese Application No. 201080030130.X.

The Japanese Examination Report dated Feb. 3, 2014 for Japanese Patent Application No. 2012-527269.

"LED Encapsulation Material for LED Device," *Shin-Etsu Chemical Co., Ltd.*, online advertisement, 2 sheets, undated, known by inventor at least as early as Oct. 2008.

"LED High Brightness Silicone Material," *Shin-Etsu Chemical Co., Ltd.*, online advertisement, 2 sheets, undated, known by inventor at least as early as Oct. 2008.

English translation of a Decision of Refusal dated Dec. 15, 2014 from corresponding Japanese Application No. 2012-527269.

* cited by examiner

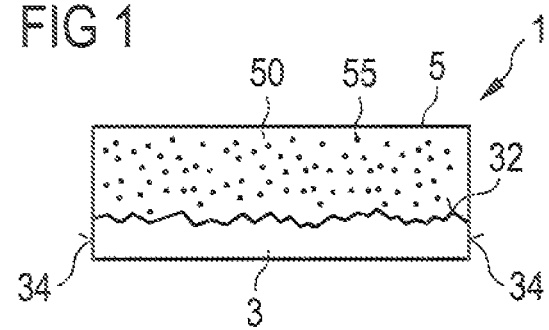
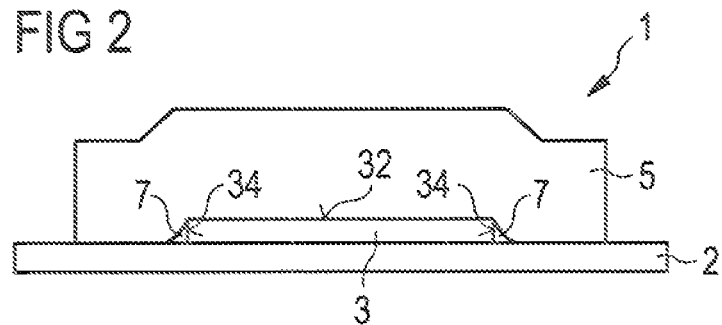
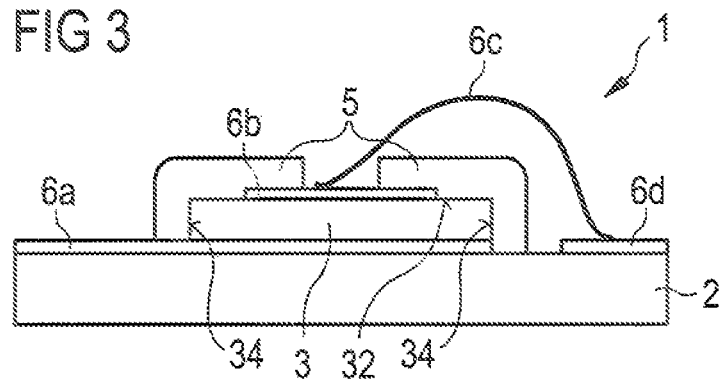
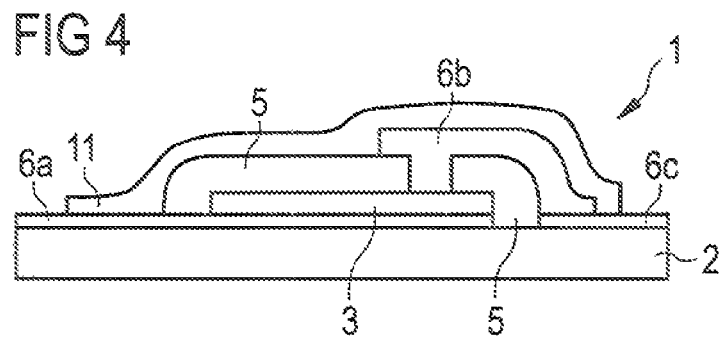

FIG 5
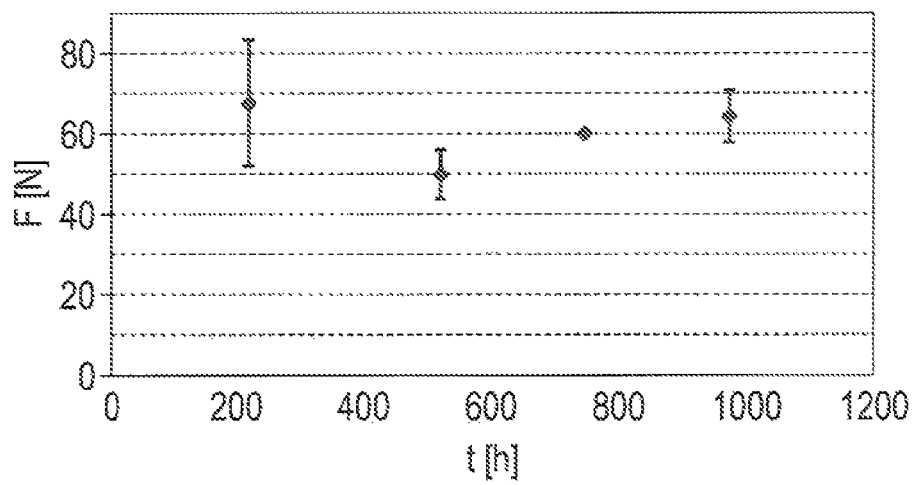
FIG 6
A)
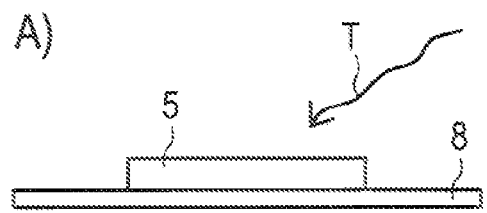
B)
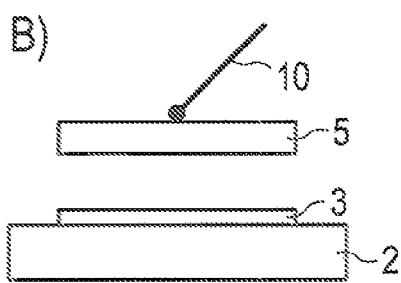
C)
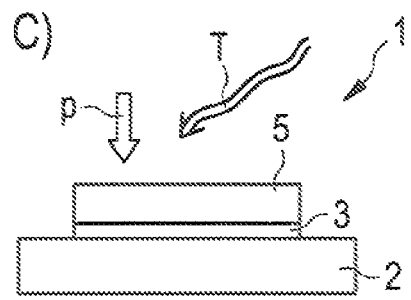

FIG 7
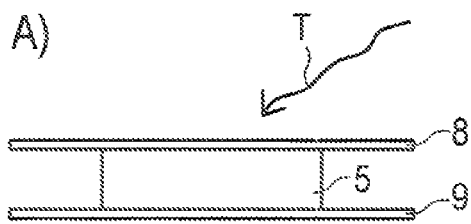
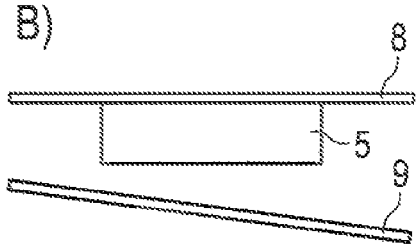
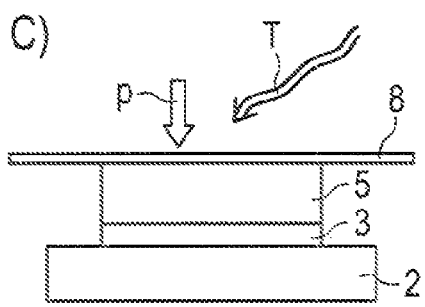
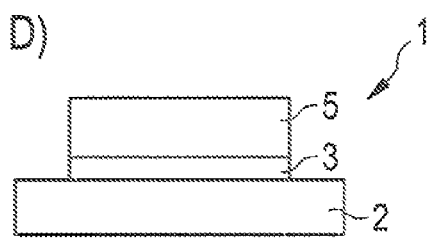
FIG 8
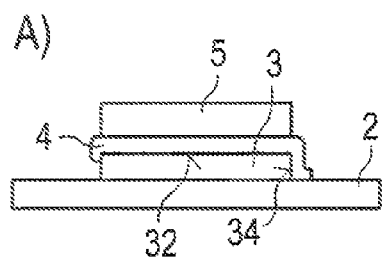
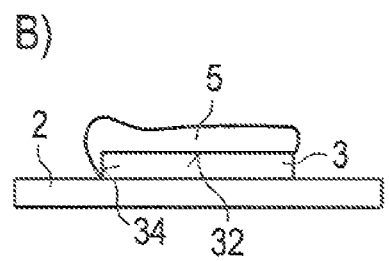

CONVERSION MEDIUM BODY, OPTOELECTRONIC SEMICONDUCTOR CHIP AND METHOD OF PRODUCING AN OPTOELECTRONIC SEMICONDUCTOR CHIP

RELATED APPLICATIONS

This is a §371 of International Application No. PCT/EP2010/061648, with an international filing date of Aug. 10, 2010 (WO 2011/026716, published Mar. 10, 2011), which is based on German Patent Application No. 10 2009 040 148.2, filed Sep. 4, 2009, the subject matter of which is incorporated by reference.

TECHNICAL FIELD

This disclosure relates to a conversion medium body and an optoelectronic semiconductor chip with a conversion medium body, as well as a method of producing an optoelectronic semiconductor chip.

BACKGROUND

It could be helpful to provide a conversion medium body which exhibits elevated adhesion to a semiconductor layer sequence. It could also be helpful to provide an optoelectronic semiconductor chip with such a conversion medium body and a method of producing such an optoelectronic semiconductor chip.

SUMMARY

I provide a conversion medium body for an optoelectronic semiconductor chip; including a matrix material, and conversion medium particles, which are embedded in the matrix material, wherein the matrix material is incompletely cured and/or crosslinked, and at room temperature the conversion medium body exhibits a hardness of between Shore A 0 and Shore A 35 inclusive and/or a viscosity of between 10 Pa·s and 150 Pa·s inclusive.

I also provide an optoelectronic semiconductor chip, including a semiconductor layer sequence including at least one active layer, and a one-piece conversion medium body with a matrix material, in which conversion medium particles are embedded, wherein the conversion medium body is in direct contact with the semiconductor layer sequence and is mounted on the semiconductor layer sequence without any bonding agent, and the hardness of the conversion medium body amounts to at least Shore A 30 and at most Shore D 80.

I further provide a method of producing an optoelectronic semiconductor chip including the steps providing a semiconductor layer sequence with at least one active layer, providing a one-piece conversion medium body with a matrix material, in which are embedded conversion medium particles, wherein the matrix material is incompletely crosslinked and/or cured, and wherein the conversion medium body exhibits at room temperature a hardness of between Shore A 0 and Shore A 35 inclusive and/or a viscosity of between 10 Pa·s and 150 Pa·s inclusive, placing the conversion medium body onto the semiconductor layer sequence, such that they are in direct contact with one another, and curing the conversion medium body, wherein after curing the hardness of the conversion medium body amounts to at least Shore A 30 and at most Shore D 80.

BRIEF DESCRIPTION OF THE DRAWINGS

FIGS. 1 to 4 are schematic sectional representations of examples of optoelectronic semiconductor chips described herein.

FIG. 5 is a schematic representation of the time dependency of the adhesion of a conversion medium body described herein to an optoelectronic semiconductor chip described herein.

FIGS. 6 and 7 are schematic representations of production methods described herein for optoelectronic semiconductor chips described herein.

FIG. 8 shows schematic sectional representations of conventional semiconductor components.

DETAILED DESCRIPTION

A conversion medium body may be mounted on an optoelectronic semiconductor chip. The semiconductor chip may comprise a photodiode, a laser diode or, preferably, a light-emitting diode. In particular, the conversion medium body has geometric dimensions comparable to those of the semiconductor chip. For example, an average lateral dimension of the semiconductor chip and/or of the conversion medium body is 0.3 mm to 10.0 mm, in particular 0.5 mm to 3.0 mm.

The conversion medium body may comprise a matrix material and conversion medium particles embedded in the matrix material. One kind or a plurality of different kinds of conversion medium particles may be used.

The matrix material may be incompletely cured and/or incompletely crosslinked. In other words, it is possible to increase the hardness and/or modulus of elasticity of the matrix material by a further curing process or crosslinking process.

The conversion medium may exhibit at room temperature a hardness of Shore A 0 to Shore A 35 or Shore A 2 to Shore A 15 and/or a viscosity of 10.0 Pa·s to 150 Pa·s or 15.0 Pa·s to 70 Pa·s. Room temperature is in particular intended to mean a temperature of approx. 293 K. The conversion medium body with the incompletely cured and/or crosslinked matrix material is thus comparatively soft.

In the conversion medium body which is intended for an optoelectronic semiconductor chip, the body may comprise a matrix material and conversion medium particles embedded in the matrix material. The matrix material is incompletely cured and/or incompletely crosslinked and the conversion medium body exhibits at room temperature a hardness of Shore A 10 to Shore A 35 and/or a viscosity of 10 Pa·s to 70 Pa·s.

The conversion medium body may be mounted interlockingly on a semiconductor layer sequence in the incompletely cured and/or crosslinked state. A particularly strong mechanical bond between the conversion medium body and the semiconductor layer sequence can be achieved by subsequent curing of the conversion medium body. The service life of the semiconductor chip may be extended in this manner.

The matrix material may comprise or consist of a silicone. It is likewise possible for the matrix material to comprise or consist of an epoxy or a silicone-epoxy hybrid material.

The conversion medium heed not contain a thixotroping agent. It has been found that, in particular by using long-chain primary materials for a silicone and/or a high viscosity starting material for the matrix material, it is possible to prevent segregation and/or settling of the conversion medium particles in the uncured matrix material. In this way, it is possible to dispense with a thixotroping agent assuming in particular particulate, especially nanoparticulate, form.

The proportion by weight of the conversion, medium particles is 20% to 75%, preferably 55% to 70%. In other words, the conversion medium particles account for a considerable proportion by weight of the conversion medium body.

The conversion medium body may be shaped in one piece. In other words, the matrix material forms a cohesive, uninterrupted unit in which are embedded the conversion medium particles. In particular, the conversion medium body then does not comprise any sub-zones with a plurality of conversion medium particles which are delimited from one another for instance by phase boundaries and/or which differ from one another with regard to average material composition and/or a physical property.

An optoelectronic semiconductor chip is furthermore provided which comprises, for example, a conversion medium body according to one or more of the above-stated examples. Features of the conversion medium body are therefore also disclosed for the optoelectronic semiconductor chip described herein and vice versa.

The optoelectronic semiconductor chip may comprise a semiconductor layer sequence with at least one active layer. The semiconductor chip furthermore contains a one-piece conversion medium body with a matrix material, in which are embedded the conversion medium particles. The conversion medium body is in direct contact with the semiconductor layer sequence and furthermore placed on the semiconductor layer sequence without any bonding agent. A hardness of the conversion medium body is at least Shore A 30 to Shore D 80, preferably at least Shore A 60 to Shore D 80, in particular at least Shore D 30 to Shore D 75.

"Without any bonding agent" may mean that no bonding agent such as an adhesive, adhesive film or solder is located between the semiconductor layer sequence and the conversion medium body. Stating that the semiconductor layer sequence and the conversion medium body are in direct contact with one another at least in places may mean that the matrix material is, at least in places, in physical contact with a semiconductor material of the semiconductor layer sequence.

Electrical contact structures which are, for example, placed directly on a semiconductor material of the semiconductor layer sequence, may be deemed to belong to the semiconductor layer sequence if the contact structures are directly, strongly, durably and/or integrally connected with the semiconductor material. In other words, "in direct contact with the semiconductor layer sequence" may also mean that the conversion medium body is placed directly on such electrical contact structures which are, for example, formed of a metal or a transparent conductive oxide.

A radiation passage area and flanks of the semiconductor layer sequence may be each at least 90% covered by the conversion medium body. The degree of coverage should in particular be determined in a direction perpendicular to the respective areas of the semiconductor layer sequence.

The conversion medium body may lie interlockingly on at least one boundary face of the semiconductor layer sequence. This means that, in particular on a microscopic scale, the conversion medium body and the boundary face cling to one another. Specifically, roughened portions of the semiconductor layer sequence may be reproduced at the boundary face by the conversion medium body. In this way, in particular on a microscopic scale, an interlocking connection may be obtained between the semiconductor layer sequence and the conversion medium body, whereby a particularly high level of adhesion may be achieved between the conversion medium body and semiconductor layer sequence. The contact surface between the semiconductor layer sequence and the conversion medium body is likewise enlarged such that bonding is also increased by adhesive forces. The side of the conversion medium body remote from the boundary face of the semiconductor body may be of smooth or planar construction such that, for example, roughening is not reproduced on this side.

Flanks of the semiconductor chip, namely lateral boundary faces in particular parallel to the growth direction of the semiconductor chip, may at most be 15% or at most 5% covered by the conversion medium body in a direction perpendicular to the flanks. In particular, the flanks are not covered by the conversion medium body.

A method of producing an optoelectronic semiconductor chip is furthermore provided. The semiconductor chip is for example configured according to one or more of the above-stated examples. Features of the conversion medium body and the optoelectronic semiconductor chip are therefore also disclosed for the method described herein and vice versa.

The method may comprise:
providing a semiconductor layer sequence with at least one active layer,
providing a one-piece conversion medium body with a matrix material in which are embedded conversion medium particles, wherein the matrix material is incompletely crosslinked and/or cured, and wherein the conversion medium body exhibits at room temperature a hardness of Shore A 0 to Shore A 35 and/or a viscosity of 10 Pa·s to 150 Pa·s,
placing the conversion medium body on the semiconductor layer sequence such that they are in direct contact with one another,
curing the conversion medium body, wherein after curing the hardness of the conversion medium body amounts to at least Shore A 30 to Shore D 80, and completing the optoelectronic semiconductor chip.

In the method, the conversion medium body may be placed on a backing film and covered with a covering film. In other words, the conversion medium body is located between the backing film and the covering film. At least the covering film may be removed non-destructively from the conversion medium body, in particular also as long as the matrix material of the conversion medium body is not yet completely cured.

Both the backing film and the covering film may be removed from the conversion medium body without damaging the latter, as long as the matrix material is not completely cured.

The backing film and/or the covering film may at least be partially radiation-transmissive in the ultraviolet and/or in the blue spectral range. In this way it is possible for the matrix material to be photochemically crosslinkable and/or curable for example through the backing film.

The conversion medium body may be provided such that the latter comprises lateral dimensions and/or shapes of the semiconductor chip, in particular with a tolerance of at most 25% or of at most 5%. The conversion medium body may thus, even before placing on the semiconductor chip, be shaped and/or cut to size in the manner of or approximately in the manner of a radiation passage area of the semiconductor chip. The conversion medium body is thus in particular shaped congruently with the radiation passage area, for example, on the backing film and placed on the semiconductor chip.

A component described herein and a method described herein will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

FIG. 1 shows an example of an optoelectronic semiconductor chip 1. The semiconductor chip 1 comprises a semiconductor layer sequence 3 which contains at least one active layer. The semiconductor layer sequence 3 is, for example, a light-emitting diode which, when in operation, in particular emits ultraviolet and/or blue radiation. Roughening is produced on a radiation passage area 32 of the semiconductor layer sequence 3. The roughening increases the outcoupling of light from the semiconductor layer sequence 3 on the radiation passage area 32. Flanks 34 are lateral boundary faces of the semiconductor layer sequence 3.

The semiconductor chip 1 furthermore comprises a conversion medium body 5. The conversion medium body 5 comprises conversion medium particles 55 embedded in a matrix material 50. The conversion medium particles 55 are distributed randomly and/or homogeneously in the matrix material 50. The conversion medium particles 55 convert radiation produced by the semiconductor layer sequence 3 when in operation partially or completely into radiation of another wavelength. The conversion medium body 5 is preferably photochemically resistant to the radiation emitted by the semiconductor layer sequence 3 and to the thermal stresses arising during operation.

An average diameter of the conversion medium particles 55 is, for example, 1 nm to 100 nm. It is likewise alternatively or additionally possible for the diameter of the conversion medium particles 55 or further conversion medium particles to be 1 µm to 20 µm. The matrix material 50 and conversion medium particles 55 are not shown in the remaining figures.

The one-piece conversion medium body 5 clings interlockingly to the roughening on the radiation passage area 32 of the semiconductor layer sequence 3. This gives rise to interlocking on a microscopic scale between the roughening of the radiation passage area 32 and the matrix material 50, whereby particularly stable adhesion can be achieved between the semiconductor layer sequence 3 and the conversion medium body 5.

In the lateral direction, the conversion medium body 5 ends flush with the flanks 34 of the semiconductor layer sequence 3. Lateral dimensions of the conversion medium body 5 and/or the semiconductor layer sequence 3 are preferably 300 µm to 3 mm, in particular 500 µm to 2 mm. The thickness of the conversion medium body preferably amounts to 20 µm to 125 µm, in particular between 30 µm to 70 µm. The thickness of the semiconductor layer sequence 3 preferably amounts to at most 200 µm, in particular at most 12 µm.

In the example according to FIG. 2, the conversion medium body 5 projects beyond the semiconductor layer sequence 3 in the lateral direction. The semiconductor layer sequence 3 is here placed on a carrier 2. The semiconductor layer sequence 3 is here completely enclosed by the carrier 2, the conversion medium body 5 and electrical contact structures (not shown in FIG. 2) for electrical contacting of the semiconductor layer sequence 3. It is here possible for a cavity 7 to form at the flanks 34 of the semiconductor layer sequence 3.

A boundary face of the conversion medium body 5 remote from the carrier 2 has a lenticular shape in a region over the radiation passage area 32. In other words, the height of the conversion medium body 5, relative to the carrier 2, is not constant over the entire lateral extent.

Electrical contact structures 6a-d are provided in the example according to FIG. 3. The contact structure 6c, which takes the form of a bond wire, here completely penetrates the one-piece conversion medium body 5 in a direction perpendicular to the main direction of extension of the semiconductor layer sequence 3.

The conversion medium body 5 here in each case covers at least 90% of the radiation passage area 32 and the flanks 34. The electrical contact structure 6b is for example vapor deposited onto a semiconductor material of the semiconductor layer sequence 3.

In the example according to FIG. 4, the one-piece conversion medium body 5 placed directly on the semiconductor layer sequence 3 is completely penetrated by the contact structure 6b, which is produced, for example, by vapor deposition and/or by a photolithographic process. Both the contact structure 6b and the conversion medium body 5 are completely covered by an electrical insulating layer 11. The material of the insulating layer 5 preferably differs from the matrix material of the conversion medium body 5.

The hardness of the conversion medium body 5 is Shore D 45 to Shore D 80. Thanks to this elevated hardness, the semiconductor layer sequence 3 may be mechanically protected by the conversion medium body 5. In addition, the elevated hardness enables particularly effective interlocking and thus elevated adhesion between the structuring or roughening of the radiation passage area 32 and the matrix material 50.

FIG. 5 illustrates the shear force F as a function of time t of a conversion medium body, for example, according to one of FIGS. 1 to 4, on a semiconductor layer sequence 3. A temperature of 185° C. prevails over the entire period of time of 1000 h. The shear force at which the conversion medium body 5 is detached, for example, from a semiconductor layer sequence 3 according to one of FIGS. 1 to 4, is at least 50 N.

FIG. 6 illustrates a method of producing the semiconductor chip 1. According to FIG. 6A, the conversion medium body 5 is placed on a backing film 8 which is, for example, an ethylene-tetrafluoroethylene film, in particular by means of a screen printing method. The conversion medium body 5 with the matrix material and the conversion medium particles is then partially cured by exposure to a temperature T of approx. 150° C. over a period of time of 4 min. The matrix material is, for example, LPS-AF500Y from the manufacturer Shin-Etsu. As a result of the partial curing, the conversion medium body has a hardness of Shore A 10 to Shore A 35 such that the conversion medium body may be placed on the semiconductor layer sequence by an automatic component insertion machine 10 (pick and place machine) as shown in FIG. 6B.

In an optional further method step not illustrated in FIG. 6, the conversion medium body 5 produced on the backing film 8 may be smoothed, so resulting in a particularly uniform thickness of the conversion medium body 5, and/or be cut to size in lateral dimensions. It is also possible, unlike the representation in FIG. 6A, for the backing film 8 to end flush with the semiconductor body 5 in the lateral direction.

FIG. 6C shows that the matrix material is then completely cured and/or crosslinked by exposure to a temperature T. The curing time preferably amounts to at least 10 min. Curing proceeds, for example, at a temperature of 150° C. over a period of time of 1 h. The conversion medium body 5 may optionally be pressed and/or held against the semiconductor layer sequence 3 by exposure to a pressure p over all or part of the thermal curing.

In the method according to FIG. 7, the conversion medium body 5 is located between the backing film 8 and a covering film 9 as shown in FIG. 7A. The conversion medium body 5 is partially cured through the backing film 8, for example, by exposure to a temperature T and/or by ultraviolet or blue radiation. After partial curing, the conversion medium body 5 exhibits only a low level of hardness and/or only a comparatively low viscosity of 10 Pa·s to 70 Pa·s inclusive. The conversion medium body 5 is shaped, for example, by rolling and optionally by subsequent singulation and/or cutting to size. Punching or compression molding is also possible, in particular if the conversion medium body 5 is shaped in lenticular manner.

According to FIG. 7B, after partial curing the covering film 9 is removed from the conversion medium body 5. The conversion medium body 5 here remains on the backing film 8.

FIG. 7C shows that the conversion medium body 5 is mounted on the semiconductor layer sequence 3 by the backing film 8. The one-piece conversion medium body 5 is cured by exposure to a temperature T or by photochemical curing, preferably with simultaneous exposure to pressure p. During curing, the backing film 8 may remain on the conversion medium body 5 or also, unlike the representation in FIG. 7C, already have been removed before complete curing and/or crosslinking of the conversion medium body 5, for example before or immediately after the conversion medium body 5 is positioned on the semiconductor layer sequence 3.

Unless the backing film 8 has already been removed before curing, it is taken off once the conversion medium body 5 is completely cured as shown in FIG. 7D.

FIG. 8 shows conventional semiconductor components which likewise comprise a conversion medium body 5. According to FIG. 8A, the conversion medium body 5, which in particular comprises a silicone, is mounted on the semiconductor layer sequence 3 by way of a bonding agent 4. The bonding agent 4 is, for example, a low viscosity silicone adhesive. Unlike the conversion medium body 5, the bonding agent 4 is transparent or clear in a spectral range in which the semiconductor layer sequence 3 generates radiation when in operation.

Because the bonding agent 4 has only a low viscosity during placing, the bonding agent 4 may partially wet the flanks 34 of the semiconductor layer sequence 3 or indeed the carrier 2 in the lateral direction while the conversion medium body 5 is being placed. Such wetting is avoidable by a specific design of the carrier 2 or of the semiconductor layer sequence 3 and by particular cleaning steps of the carrier 2. Such measures do, however, increase manufacturing costs. Because, for instance according to FIGS. 1 to 4, the conversion medium body 5 is placed without any bonding agent, there is no risk of the bonding agent 4 contaminating for example the carrier 2 and it is possible to dispense with a complex design of the carrier 2 and/or of the semiconductor layer sequence 3.

According to FIG. 8B, the conversion medium body 5 is placed directly on the semiconductor layer sequence 3 by a screen printing method. Such a method entails elevated precision and is comparatively costly. To mount the conversion medium body 5 directly on the semiconductor chip 3, the starting material and in particular also the finished conversion medium body 5 has only a comparatively low hardness, in particular, less than Shore A 80 or less than Shore A 60.

In addition to the material limitation with regard to hardness in the ease of a screen printing method directly onto the semiconductor layer sequence 3, the thickness of the conversion medium body 5 is relatively uneven in comparison with a conversion medium body 5 according to FIGS. 1 to 4, whereby local variations in color location of wavelength-converted radiation may occur. Just as when a bonding agent 4 is used, direct printing of the conversion medium body 5 onto the semiconductor layer sequence 3 entails a risk of the material of the conversion medium body 5 contaminating the flanks 34 or the carrier 2.

The bodies, chips arid methods described herein are not restricted by the description given with reference to the examples. Rather, the disclosure, encompasses any novel feature and any combination of features, including in particular any combination of features in the appended claims, even if the feature or combination is not itself explicitly indicated in the claims or examples.

The invention claimed is:

1. A method of producing an optoelectronic semiconductor chip comprising:
   providing a semiconductor layer sequence with at least one active layer,
   providing a one-piece conversion medium body with a matrix material into which are embedded conversion medium particles, wherein the matrix material is incompletely crosslinked and/or cured, the conversion medium body is placed on a backing film and covered by a covering film, and at least the backing film is at least partially radiation-transmissive in ultraviolet and blue spectral ranges, and
   the conversation medium body exhibits at 293 K a viscosity of 10 Pa·s to 150 Pa·s,
   placing the conversion medium body onto the semiconductor layer sequence such that they are in direct contact with one another, and
   curing the conversion medium body such that after curing hardness of the conversion medium body at 293K is at least Shore A 30 to Shore D 80, wherein, during curing, the backing film remains on the conversion medium body.

2. The method according to claim 1, wherein:
   after placing the semiconductor layer sequence on a carrier, the conversion medium body projects beyond the semiconductor layer sequence in a lateral direction,
   in the semiconductor chip the semiconductor layer sequence is completely enclosed by the carrier, the conversion medium body and electrical contact structures that electrically contact the semiconductor layer sequence, and
   a cavity is formed at flanks of the semiconductor layer sequence.

3. The method according to claim 1, wherein the matrix material comprises a silicone or consists of a silicone.

4. The method according to claim 1, wherein the conversion medium body does not contain a thixotroping agent and is free of nanoparticles that form the thixotroping agent.

5. The method according to claim 1, containing 20% to 75% by weight of the conversion medium particles based on the weight of the conversion medium body.

6. The method according to claim 5, containing 55% to 70% by weight of the conversion medium particles based on the weight of the conversion medium body.

7. The method according to claim 3, further comprising locating the conversion medium body between the backing film and the covering film, wherein the backing film and the covering film are removable from the conversion medium body without damaging as long as the matrix material is not completely cured.

8. The method according to claim 1, wherein a lateral dimension of the conversion medium body is 300 μm to 3 mm, and the conversion medium body has a thickness of 20 μm to 125 μm.

9. The method according to claim 1, wherein the curing is photochemical curing.

10. A method of producing an optoelectronic semiconductor chip comprising:

providing a semiconductor layer sequence with at least one active layer, providing a one-piece conversion medium body with a matrix material into which are embedded conversion medium particles, wherein the matrix material is incompletely crosslinked and/or cured, the conversion medium body is placed on a backing film and covered by a covering film, and at least the backing film is at least partially radiation-transmissive in ultraviolet and blue spectral ranges, and wherein the conversion medium body exhibits at 293K a viscosity of 15 Pa·s to 70 Pa·s, smoothing the conversion medium body produced on the backing film, thereby resulting in a uniform thickness of the conversion medium body, and cutting the conversion medium body to size in lateral dimensions, subsequently placing the conversion medium body onto the semiconductor layer sequence such that they are in direct contact with one another, and photochemically curing the conversion medium body such that after curing hardness of the conversion medium body at 293 K is at least Shore A 30 to Shore D 80, wherein, during curing, the backing film remains on the conversion medium body, wherein:

the conversion medium body projects beyond the semiconductor layer sequence in a lateral direction after placing the semiconductor layer sequence on a carrier, after completing curing the conversion medium body, the semiconductor layer sequence is completely enclosed by the carrier, the conversion medium body and electrical contact structures that electrically contact the semiconductor layer sequence, a cavity is formed at flanks of the semiconductor layer sequence, the conversion medium particles are distributed randomly and homogeneously in the matrix material, and a thickness of the conversion medium body is 20 μm to 125 μm and a thickness of the semiconductor layer sequence is at most 12 μm.

\* \* \* \* \*

UNITED STATES PATENT AND TRADEMARK OFFICE
CERTIFICATE OF CORRECTION

PATENT NO. : 9,055,655 B2  
APPLICATION NO. : 13/377593  
DATED : June 9, 2015  
INVENTOR(S) : Braune Page 1 of 1

It is certified that error appears in the above-identified patent and that said Letters Patent is hereby corrected as shown below:

In the claims

In Column 8

At line 23, claim 1, please change "conversation" to --conversion--.

Signed and Sealed this
Twentieth Day of October, 2015

Michelle K. Lee
*Director of the United States Patent and Trademark Office*